United States Patent
Wang

(10) Patent No.: US 7,333,332 B2
(45) Date of Patent: Feb. 19, 2008

(54) HEATSINK THERMAL MODULE WITH NOISE IMPROVEMENT

(75) Inventor: Frank Wang, Taipei (TW)

(73) Assignee: Inventec Corporation, Taipei (TW)

( * ) Notice: Subject to any disclaimer, the term of this patent is extended or adjusted under 35 U.S.C. 154(b) by 251 days.

(21) Appl. No.: 11/056,164

(22) Filed: Feb. 14, 2005

(65) Prior Publication Data

US 2006/0181849 A1    Aug. 17, 2006

(51) Int. Cl.
*H05K 7/20* (2006.01)

(52) U.S. Cl. .............. 361/700; 361/695; 361/697; 165/80.3; 165/80.4; 165/121; 174/15.2; 174/16.3

(58) Field of Classification Search ............. None
See application file for complete search history.

(56) References Cited

U.S. PATENT DOCUMENTS

| | | | | |
|---|---|---|---|---|
| 5,727,624 A * | 3/1998 | Ko et al. | ...... | 165/121 |
| 5,867,365 A * | 2/1999 | Chiou | ...... | 361/690 |
| 6,227,286 B1 * | 5/2001 | Katsui | ...... | 165/80.3 |
| 6,243,263 B1 * | 6/2001 | Kitahara | ...... | 361/695 |
| 6,301,901 B1 * | 10/2001 | Coffee et al. | ...... | 62/3.7 |
| 6,328,097 B1 * | 12/2001 | Bookhardt et al. | ..... | 165/104.33 |
| 6,373,700 B1 * | 4/2002 | Wang | ...... | 361/698 |
| 6,421,239 B1 * | 7/2002 | Huang | ...... | 361/696 |
| 6,487,076 B1 * | 11/2002 | Wang | ...... | 361/697 |
| 6,643,129 B2 * | 11/2003 | Fujiwara | ...... | 361/687 |
| 6,650,540 B2 * | 11/2003 | Ishikawa | ...... | 361/695 |
| 6,778,390 B2 * | 8/2004 | Michael | ...... | 361/695 |
| 6,830,429 B2 * | 12/2004 | Hirata | ...... | 415/206 |
| 7,071,587 B2 * | 7/2006 | Lopatinsky et al. | ...... | 310/64 |
| 7,130,192 B2 * | 10/2006 | Wang et al. | ...... | 361/697 |
| 7,140,423 B2 * | 11/2006 | Chang | ...... | 165/104.33 |
| 2003/0002257 A1 * | 1/2003 | Watanabe et al. | ...... | 361/697 |
| 2003/0121645 A1 * | 7/2003 | Wang | ...... | 165/104.26 |

* cited by examiner

*Primary Examiner*—Boris Chervinsky
(74) *Attorney, Agent, or Firm*—Venable LLP; Raymond J. Ho

(57) ABSTRACT

The invention provided a heatsink thermal module with noise improvement, which has a heatsink thermal module additionally consisting of a heat pipe, a heatsink fins set and a fan module; the fan module is combined with the heatsink fins set which consists of multiple heatsink fins with different lengths and is combined to the fan module with its end with a special geometric shape having the function of lowering the wind drag; by lowering the wind drag, not only the heat dissipation efficiency can be increased, but the noise caused by the heatsink thermal module can also be improved.

15 Claims, 7 Drawing Sheets

HEATSINK THERMAL MODULE WITH NOISE IMPROVEMENT

BACKGROUND OF THE INVENTION

1. Field of the Invention

This disclosed invention relates to a heatsink thermal module with noise improvement, and particularly a thermal module with noise improvement with a heatsink fins set consisting of multiple heatsink fins with different lengths to achieve the objective of lowering the wind drag.

2. Description of the Related Art

Following the progress in information technology, the design of computers changes rapidly; the computers are designed to be lighter, slimmer, smaller and portable, and the requirement on their speed of data processing gets higher and higher; relatively, the design concerning the heat dissipation efficiency of heat generating components, such as central processing unit (CPU) and video graphics array (VGA) chips, become the key point and is especially challenging for light weight and easy carriage notebook computers.

The heatsink thermal modules used by the CPU or other heat generating components of notebook computers are usually made of high heat-conductive metal, which, by contacting the heat generating component of computers, transmits the heat to the heatsink fins set and, by means of the fan which provides strong cooling airflow toward the heatsink fins for heat exchange. The cumulated heat on the heatsink fins set can thus be brought away.

The heatsink fins set of conventional thermal modules is mounted on the airflow outlet to hinder the cooling airflow from increasing the wind drag; the higher the wind drag is, the lower the efficiency of cooling is and the more noise is produced. As shown in FIGS. 1A and 1B, which illustrate respectively the conventional heatsink module and the velocity profile diagram of the airflow outlet of the conventional heatsink module, the test is run by processing the data collected from the sensor which detects the airflow speed at a two-centimeter interval on the outer side of the fan module 100 from left to right (the direction is shown by the arrow D of FIG. 1A), and, as a result, the total airflow speed is 257.37 m/sec. As shown in FIGS. 2A and 2B, which illustrate respectively the conventional heatsink module and the velocity profile diagram of the airflow outlet of the conventional heatsink module; after the combination of the fan module 100 and the heatsink fins set 102, the total airflow speed drops from original 257.37 m/sec to 137.21 m/sec, which proves that the wind drag of conventional heatsink fins set 102 is rather elevated and the noise produced by the heatsink thermal module 101 is also higher. Users who work in a highly noisy environment over a long period of time would suffer from neurasthenia and absent-mindedness which result in lower working efficiency.

For this, this invention provides a heatsink thermal module which can improve the unbalanced heat dissipation and the noise caused by the fan module and efficiently settles the above-mentioned defects.

SUMMARY OF THE INVENTION

In view of the problems of conventional techniques, the main purpose of this invention is to provide a heatsink thermal module with noise improvement which has the function of lowering the wind drag, raising consequently the heat dissipation efficiency and improving effectively the problem of the noise caused by the heatsink thermal module.

For attaining the above-mentioned purposes, this invention provides a heatsink module with noise improvement comprising a heatsink module which consists additionally of a heat pipe, a heatsink fins set composed by multiple heatsink fins with different lengths, and a fan module which is combined with the heatsink fins set.

The characteristic of this invention disclosed is relating to a heatsink thermal module with noise improvement is, by assembling multiple heatsink fins with different lengths, the construction of a heatsink thermal module with noise improvement with the function of lowering the wind drag and improving the noise.

For better understanding of characteristics, purposes and advantage of this invention, the detailed descriptions of the preferred embodiment with relating graphics are as follows:

DETAILED DESCRIPTION OF THE INVENTION

Figure 3:
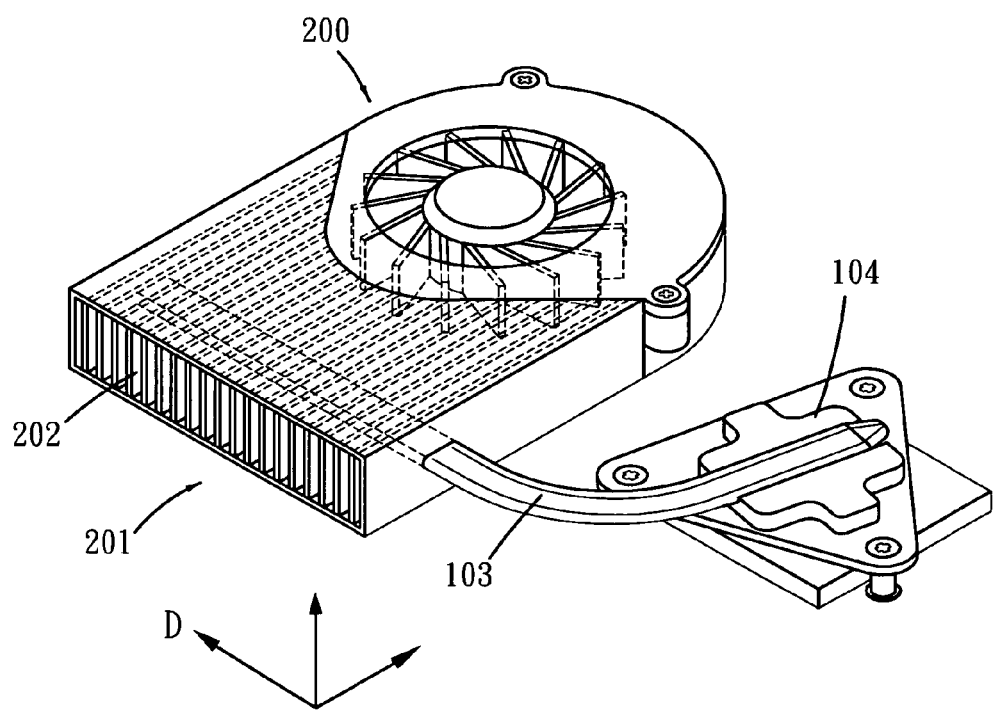
FIG. 3 is the three-dimension view of the present invention.
Figure 4:
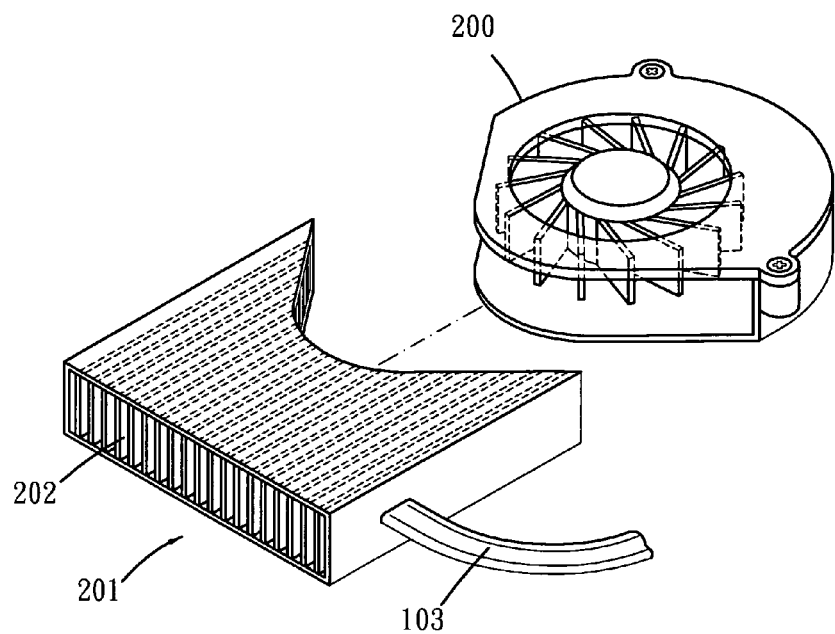
FIG. 4 is the perspective three-dimension view of the present invention.

As shown in FIG. 3 and FIG. 4, which are respectively the three-dimension view and the perspective three-dimension view of a desired embodiment of the heatsink thermal module with noise improvement, a heatsink thermal module 201 additionally consists of a heat pipe 103, a heatsink fins set 202 and a fan module 200 which is combined with the heatsink fins set 202.

Wherein the heat pipe 103 is made of highly heat-conductive material with its one end thermally connected to the heatsink fins set 202 and the other end thermally connected to the heat-conductive plate 104 to transmit the heat generated by the heat-generating component to the heatsink fins set 202, the heat pipe 103 homogeneously diffuses the heat to the heatsink fins set 202 during the heat-conducting process.

Figure 5:
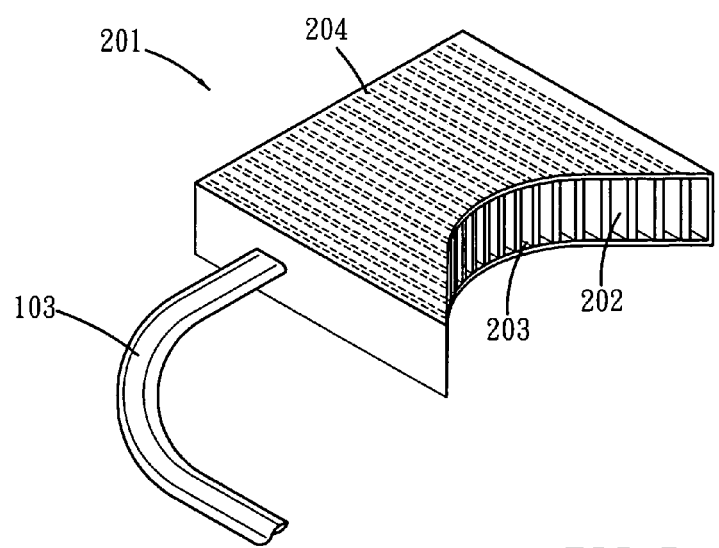
FIG. 5 is the three-dimension view of the heatsink fins set of the present invention.

As shown in FIG. 5, which illustrates the three-dimension view of the heatsink fins set of this invention, the heatsink fins set 202 is composed of multiple parallel heatsink fins with different lengths where each heatsink fin is in form of slice. The heat pipe 103 thermally connects with each heatsink fin by penetrating its center for equivalent heat-conducting distance. By the spread of the heatsink area of the heatsink fins set 202, the heat transmitted by the heat pipe 103 can be effectively diffused and spread. The fan module 200 generates the cooling airflow which is parallel to the direction of the longitudinal axis of the heatsink fins for bringing away the heat cumulated on the heatsink fins set 202 by heat exchange between the cooling airflow and the heatsink fins set 202. The objectives of lowering the temperature and increasing the heat dissipation efficiency can thus be achieved.

Furthermore, the heatsink fins set 202 contains an airflow outlet 204 with the linear cut appearance and an airflow entrance 203 next to the fan module 200 with an adequate geometric shape such as the shape of a conjugate curve, an involute curve or any inward concave which makes the heatsink fins at its two sides longer than those at its center part, which can lower the wind drag by the special shape of the heatsink fins set 202 when the fan module 200 generates cooling airflow toward the heatsink fins set. Consequently, the objective of faster heat dissipation is achieved. Since the main purpose of the heatsink thermal module 201 is to conduct, transmit and dissipate heat, the material chosen for its fabrication shall be high-temperature resistant and high heat-conductive. The metal copper is utilized in this embodiment.

Figure 1A:
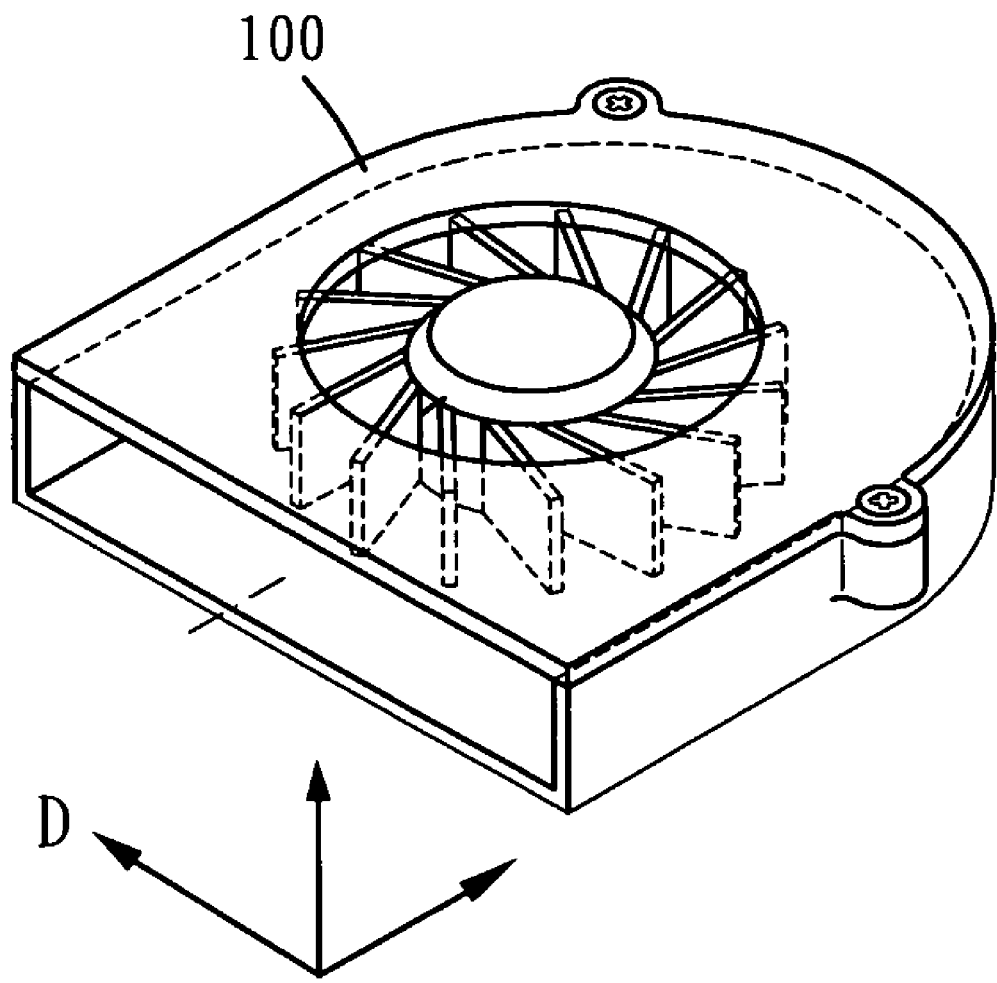
FIG. 1A is the conventional fan module.
Figure 1B:
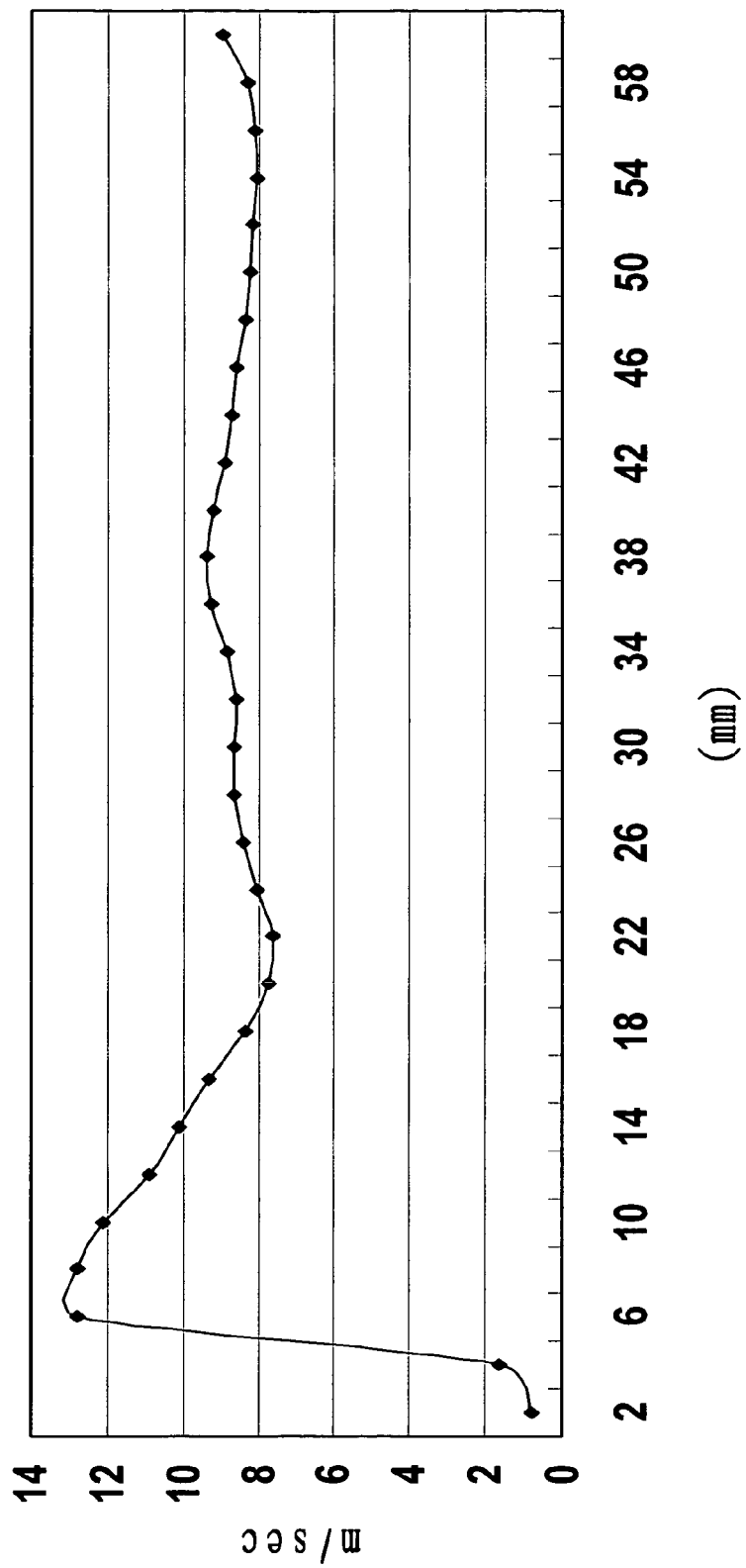
FIG. 1B is the velocity profile diagram of the conventional fan module.
Figure 2A:
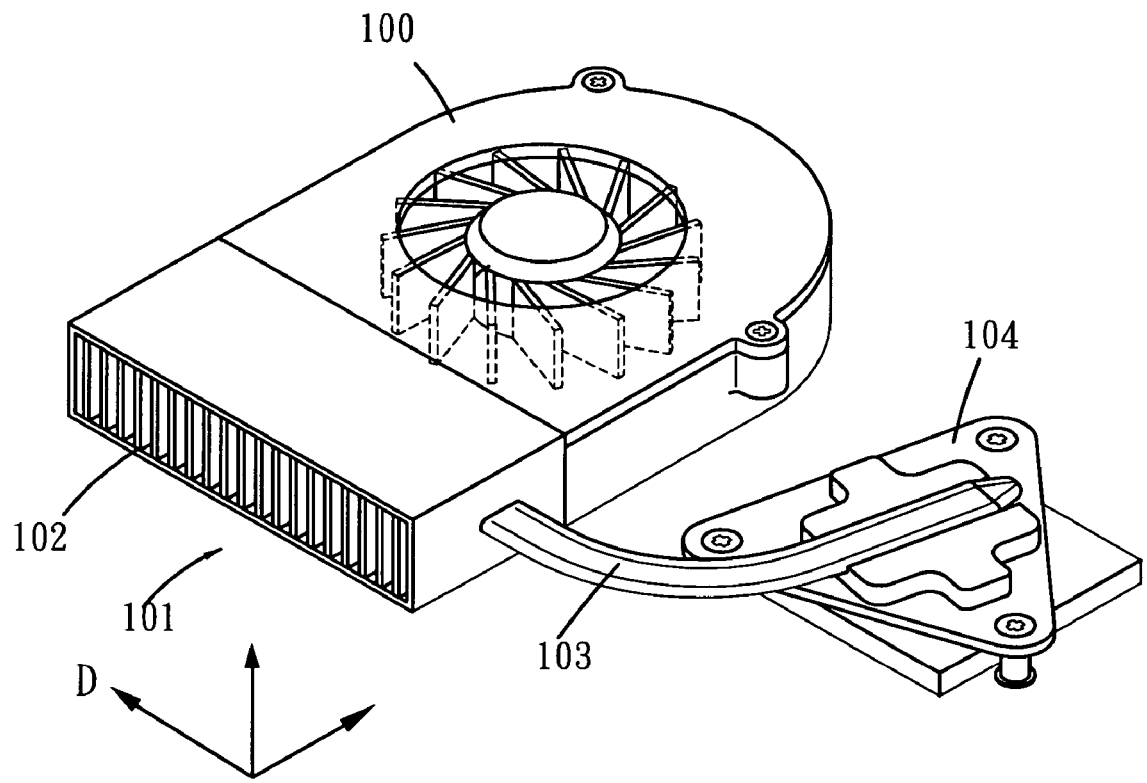
FIG. 2A is the conventional heatsink module.
Figure 2B:
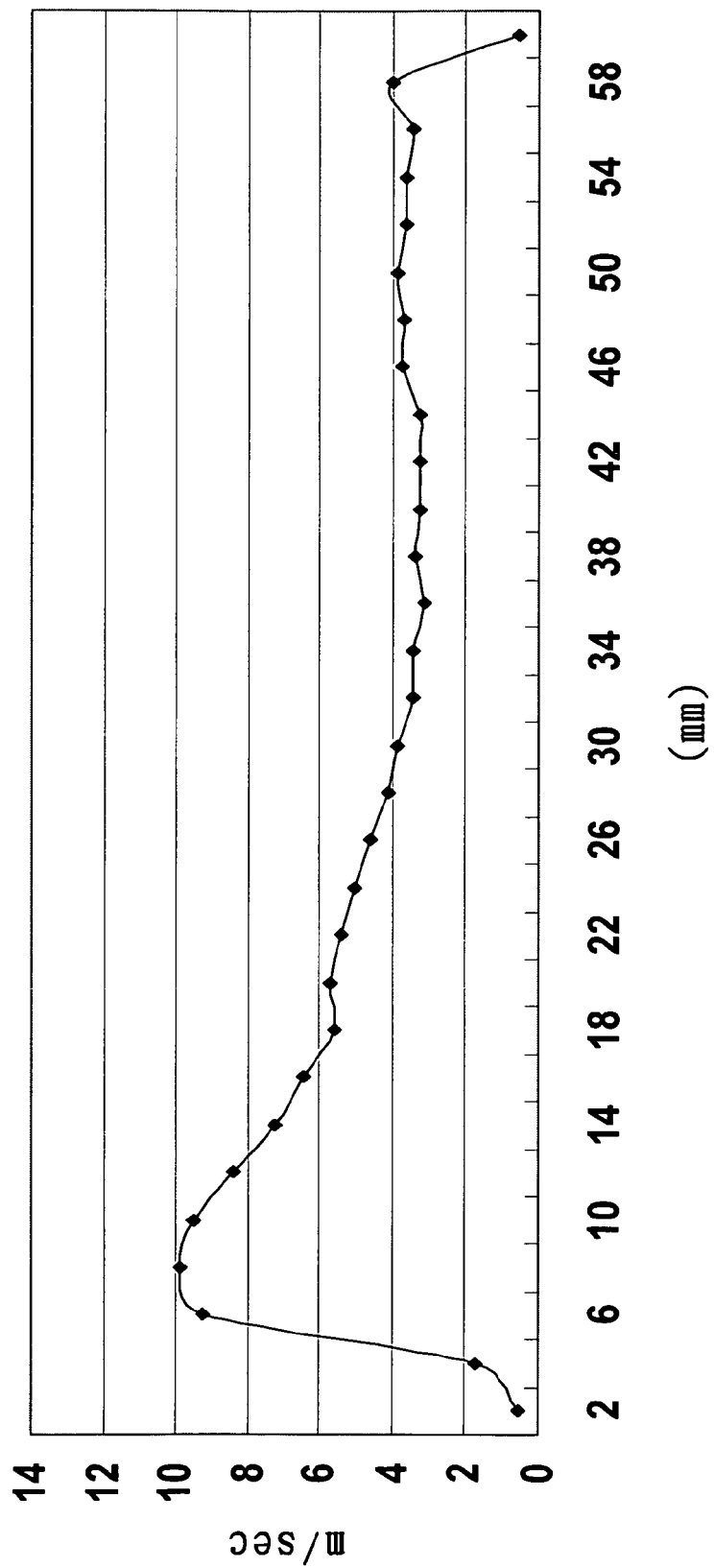
FIG. 2B is the velocity profile diagram of the conventional heatsink module.
Figure 6:
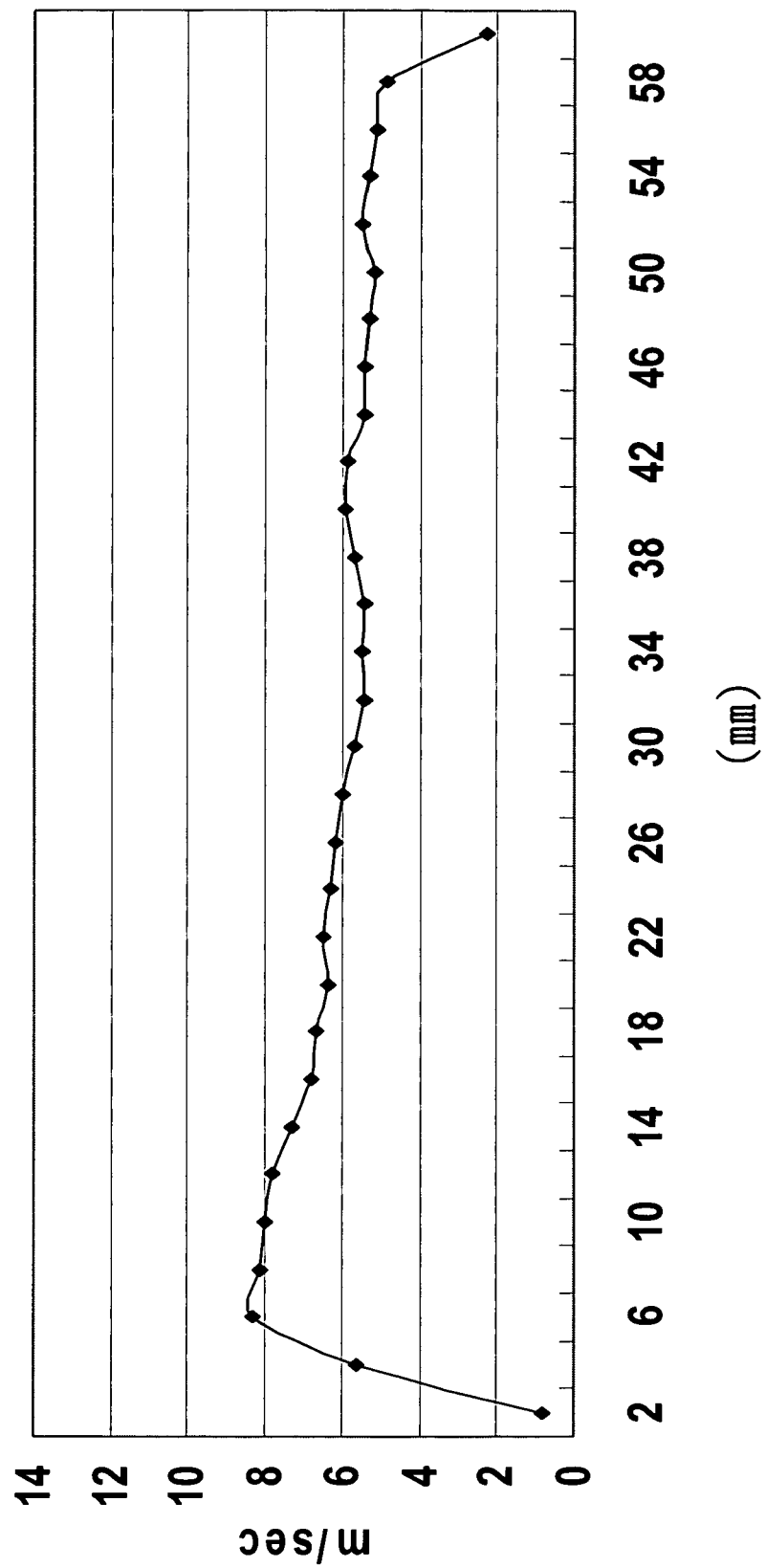
FIG. 6 is the velocity profile diagram of the present invention.

As shown in FIG. 6, which is the velocity profile diagram of this invention, the airflow of the cooling airflow generated by the fan module 200 blows toward the heatsink fins set passes each testing point on the airflow outlet 204 at a total airflow speed of 174.61 m/sec which shows a significant increase comparing to the FIG. 2 where the testing result (137.21 m/sec) of conventional heatsink fins set 102. It is thus clear that the design of this invention can lower the wind drag of the cooling airflow generated by the fan module 200 toward the heatsink fins set 202 and since the lower the wind drag is, the lesser the volume, the objective of noise improvement can therefore be achieved.

The characteristic of this invention disclosed is concerning a heatsink thermal module with noise improvement is that, by assembling metal fins with different lengths, a special designed heatsink fins set 202 is structured to improve the heat dissipation efficiency and to lower the noise. We see that this invention satisfies the noise-improvement requirement comparing to the conventional heatsink thermal modules.

While the present invention has been described with reference to a preferred embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A heatsink thermal module with noise improvement comprising:
    a heatsink fin module consisting of a heat pipe and a heatsink fins set of a curved shape which is composed of multiple heatsink fins with different lengths, the heat pipe being formed to penetrate the heatsink fins so as to thermally connect with each of the heatsink fins; and
    a fan module having a curved outlet externally placed adjacent to a curved inlet of the heatsink fin module.

2. The heats ink thermal module with noise improvement of claim 1, wherein the heatsink fins are arranged in a parallel manner.

3. The heatsink thermal module with noise improvement of claim 1, wherein the heatsink fins are made of metal.

4. The heatsink thermal module with noise improvement of claim 1, wherein the heatsink fins are made of copper.

5. The heatsink thermal module with noise improvement of claim 1, wherein the airflow outlet of the heatsink fins set is uniform.

6. The heatsink thermal module with noise improvement of claim 1, wherein the airflow entrance is of special geometric shape that is as a conjugate curve or involute.

7. The heatsink thermal module with noise improvement of claim 6, wherein the direction of the longitudinal axis of each heatsink fin is parallel to the direction of the cooling airflow generated by the fan module.

8. The heatsink thermal module with noise improvement of claim 6, wherein the heatsink fins at the two sides of the airflow entrance are longer than those situated at the center part of the airflow entrance.

9. A heatsink thermal module with noise improvement, comprising:
    a heatsink fin module further consisting of a heat pipe and a heatsink fins set, the heatsink fins set composed by multiple heatsink fins with different lengths, the heatsink fins having an airflow entrance with an inward concave shape, the heat pipe being formed to penetrate the heatsink fins so as to thermally connect with each of the heats ink fins; and
    a fan module externally placed adjacent to the airflow entrance of the heatsink fins set and having an outlet with a corresponding curve shape to combine with the inward concave shaped inlet of the heatsink fin module.

10. The heatsink thermal module with the noise improvement of claim 9, wherein the heatsink fins are arranged in a parallel manner.

11. The heatsink thermal module with noise improvement of claim 9, wherein the heats ink fins are made of metal.

12. The heatsink thermal module with noise improvement of claim 9, wherein heatsink fins are made of copper.

13. The heatsink thermal module with noise improvement of claim 9, wherein the airflow outlet of the heatsink fins set is uniform.

14. The heatsink thermal module with noise improvement of claim 9, wherein the inward concave shape is formed as a conjugate curve or, an involute curve.

15. The heatsink thermal module with noise improvement of claim 9, wherein the direction of the longitudinal axis of each heatsink fin is parallel to the direction of the cooling airflow generated by the fan module.

* * * * *